United States Patent [19]
Zampini et al.

[11] Patent Number: 5,343,186
[45] Date of Patent: Aug. 30, 1994

[54] VARIABLE RESISTOR HAVING THE CAPACITY TO PRODUCE A FADER START SIGNAL OUTPUT

[75] Inventors: Michael Zampini, Boca Raton; Joseph S. Dombrowski, Hollywood; Donald E. Davis, Margate, all of Fla.

[73] Assignee: Sony Electronics Inc., Park Ridge, N.J.

[21] Appl. No.: 54,577

[22] Filed: Apr. 29, 1993

[51] Int. Cl.$^5$ .................................. H01L 31/08
[52] U.S. Cl. ........................ 338/15; 338/119; 338/196; 250/214 PR
[58] Field of Search .......... 338/15, 17, 18, 119, 338/196; 250/214 PR

[56] References Cited
U.S. PATENT DOCUMENTS

| | | | |
|---|---|---|---|
| 3,680,024 | 7/1972 | Tashiyo et al. | 338/17 |
| 3,859,617 | 1/1975 | Oka et al. | 338/15 |
| 3,878,500 | 4/1975 | Svechnikov et al. | 338/15 |
| 4,276,534 | 6/1981 | Meyer et al. | 338/15 |
| 4,283,702 | 8/1981 | Meyer et al. | 338/15 |
| 4,523,090 | 6/1985 | Wagner | 338/15 X |
| 4,796,000 | 1/1989 | Mondl | 338/15 |

*Primary Examiner*—Marvin M. Lateef
*Attorney, Agent, or Firm*—Robert P. Biddle; Jerry A. Miller

[57] ABSTRACT

A variable control fader with provisions for outputting a fader start signal upon movement of the fader from a position corresponding to the faders maximum attainable resistance value. This fader start signal can be utilized to initiate the activation or deactivation of the operation, or function, of other devices such as, for example, tape recorders, cart machines, or outboard signal processing equipment.

22 Claims, 4 Drawing Sheets

VARIABLE RESISTOR HAVING THE CAPACITY TO PRODUCE A FADER START SIGNAL OUTPUT

FIELD OF THE INVENTION

The present invention relates to a variable resistor and control console for use in radio broadcasting, audio recording, public address systems, lighting control systems and the like.

BACKGROUND

Audio mixing consoles, such as console 1 of FIG. 1 which is housed by housing 14, are in wide common use in radio broadcasting, audio recording and the like. These mixing consoles are generally utilized in conjunction with other equipment, such as tape recorders, cart machines, or outboard audio processing equipment and often incorporate a number of continuously variable resistors, or attenuators. These variable resistors are commonly called faders. Most audio faders in use in today's audio mixing consoles, such as faders 2–13 shown in FIG. 1, are of a sliding straight line type generally referred to as a linear fader. Typical linear faders incorporate a resistance track which is in electrical contact with a sliding wiper, or slider. This slider is essentially a movable electrical terminal which acts to vary the total fader resistance value depending upon its position or point of contact along the resistance track. The position of a fader slider at which essentially no audio signal volume, or gain, is produced is commonly referred to as the infinity ($\infty$) position. The infinity ($\infty$) position typically corresponds to a fader's maximum attainable resistance value. FIG. 2 shows a schematic diagram of a typical linear fader having a resistance track 15, a wiper 16 and a guide track 17.

It is often desirable to cue or actuate the operation or functions of certain equipment upon commencing an increase of volume, or gain, of an audio signal from a zero gain. For example, it is often desirable to have a tape recorder begin recording as soon as the audio signal level begins to increase. This is commonly achieved through the use of an audio fader having provisions for outputting a signal upon movement of the fader from the infinity (zero gain) or maximum resistance position. This type of signal is commonly referred to as a "fader start" signal.

Common audio faders which do provide for a "fader start" output signal, such as those available from ALPS, P&G, Clairestats and Burns, produce undesirable audible noises upon movement of the fader from the infinity ($\infty$) position. In radio broadcasting and audio recording applications, extraneous noises can be very distracting to personnel who are monitoring or listening to ongoing audio program material or performances. Noises such as "clicking" or "popping" sounds produced by an audio fader can distract personnel. Further, the importance of the "feel", or tactile sensation provided by an audio fader, is widely recognized by those involved in the radio broadcasting or audio fields and the like. It is generally desirable for the "feel" of an audio fader to be smooth and consistent throughout the range of travel of the audio fader, from the infinity position to the zero position. Commonly available audio faders having fader start features lack the smooth and consistent feel which is most often desired by professionals.

Other common audio faders provide for a fader start output signal by directing a DC current through the fader signal path along with an AC audio signal. Movement of the fader slider, or wiper, changes the amount of DC current flow through the fader signal path since the fader's resistance value is changed as the fader slider is moved. Once the DC current goes below a predetermined level which corresponds to a maximum fader resistance value, a signal is output to indicate that the fader slider is in the infinity ($\infty$) or maximum fader resistance value position. As the fader slider is moved away from the infinity position, i.e. as the total fader resistance value is decreased from maximum value, the DC current level increases above the predetermined current level. Once the DC current goes above this predetermined level, a fader start signal is generated. Although this type of audio fader does not generally produce audible noises upon fader movement and generally does not have an inconsistent and unsmooth feel, it may require substantial costly supporting circuitry which must be periodically calibrated to obtain proper performance.

The reason for these shortcomings typically rests with the manner in which common audio faders are generally constructed so as to provide for fader start functions. More specifically, it is common for audio faders to incorporate mechanical switching elements which are positioned within the fader in such a way that the mechanical switching element is actuated whenever the slider is moved away from a position corresponding to the faders' infinity ($\infty$) or maximum resistance position. When the slider is positioned at the infinity position, mechanical switching elements are de-actuated. As the slider is moved from the infinity ($\infty$) position toward the zero or minimum resistance level, the mechanical switching element is actuated, thereby causing a fader start signal to be generated. As the mechanical switching elements are actuated, an undesirable audible "click" or "pop" sound is produced. Further, due to the frictional forces exerted on the slider by the mechanical switching elements coming into physical contact with the slider upon being placed at the infinity ($\infty$), the "feel" of the fader slider changes as it is moved to or from the infinity resistance position. Because of the substantial physical interaction of mechanical switching elements, the reliability of this type of common audio fader is greatly undermined.

FIGS. 3 and 4 show an illustration of a common audio fader having fader start features. It can be seen that this audio fader 200 has a mechanical switch 220 positioned toward one end of fader 200. Switch 220 has a spring loaded actuator arm 230 which is depressed or actuated upon physical contact with slider 240. With reference to FIG. 3, it can be seen that slider 240 may be moved or slided along track guides 260 and 261, which extend the length of fader 200. When slider 240 is in the infinity ($\infty$) position, it causes actuator arm 230 to be depressed, thereby opening switch 220. As shown in FIG. 4, when slider 240 is moved away from the infinity ($\infty$) position, it is moved from contact with actuator arm 230 thereby causing switch 220 to close and thus produce a fader start signal which cues other equipment operation/function.

BRIEF SUMMARY OF THE INVENTION

The present invention relates to an audio mixing or control console having a plurality of variable resistors or faders. Each fader has a resistance track which electrically contacts a movable slider via a wiper attached to the movable slider. A photo sensitive switch means which is responsive to the position of the movable slider is also provided.

DESCRIPTION OF THE INVENTION

Figure 1:
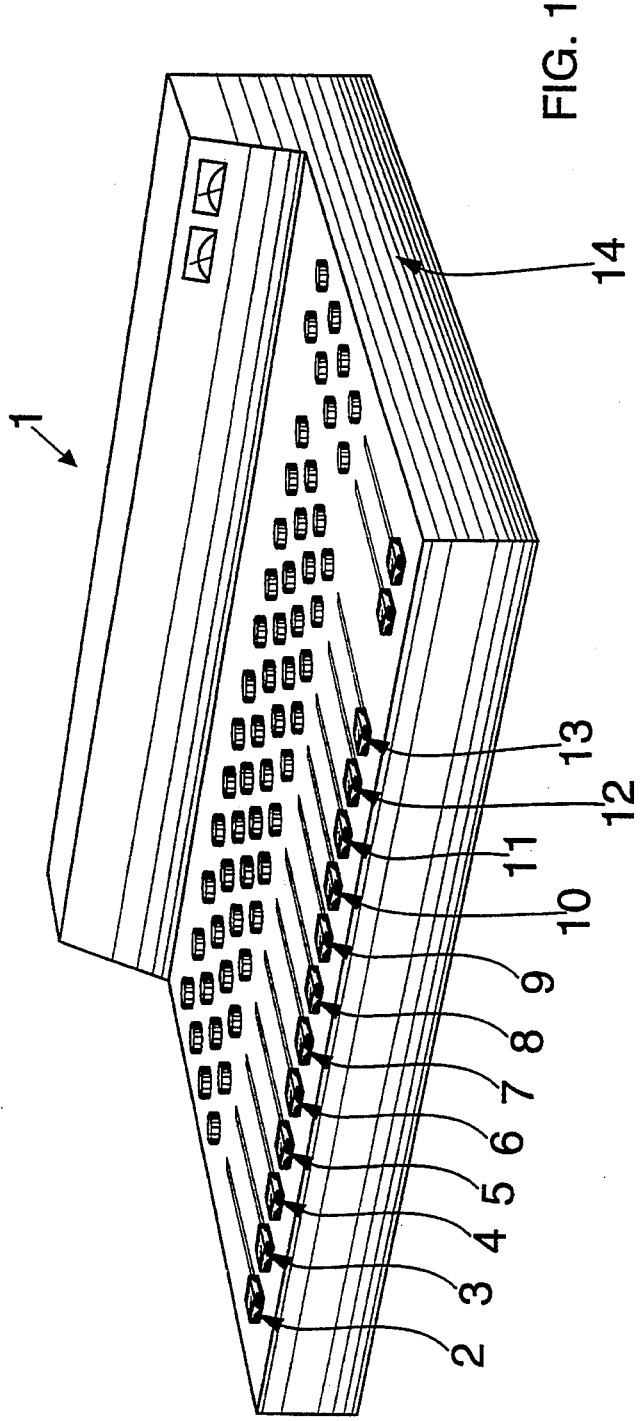
FIG. 1 is an illustration of a typical audio mixing or control console.
Figure 2:
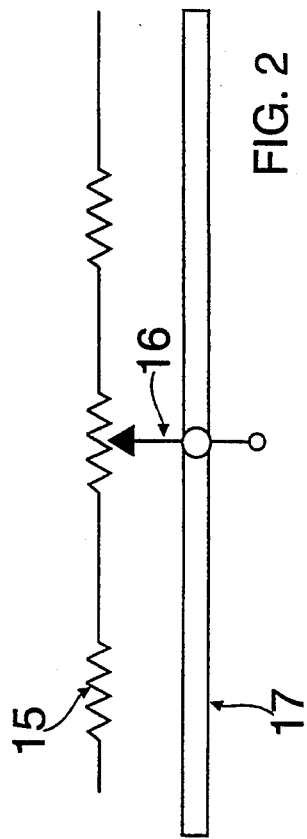
FIG. 2 is a schematic diagram of a typical linear audio fader.
Figure 3:
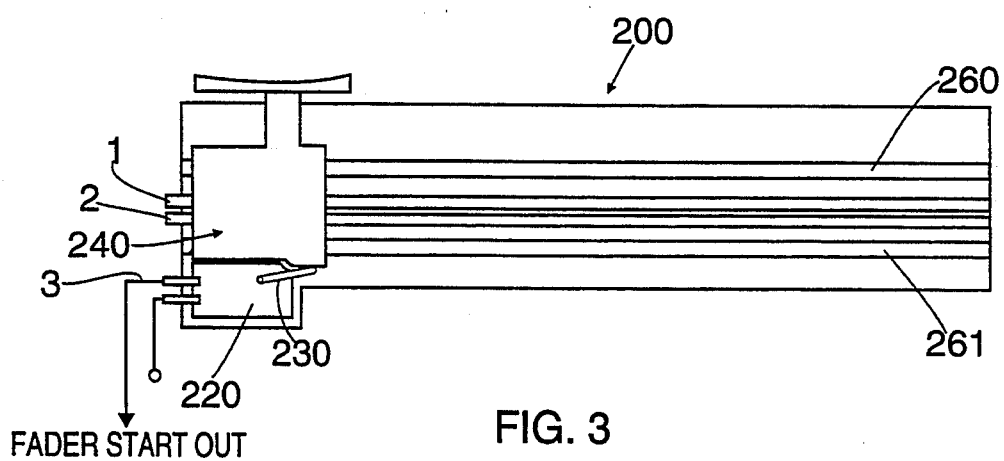
FIG. 3 is an illustration showing a typical audio fader, with fader start functions, in which the slider is positioned at the zero gain or infinity (∞) resistance position.
Figure 4:
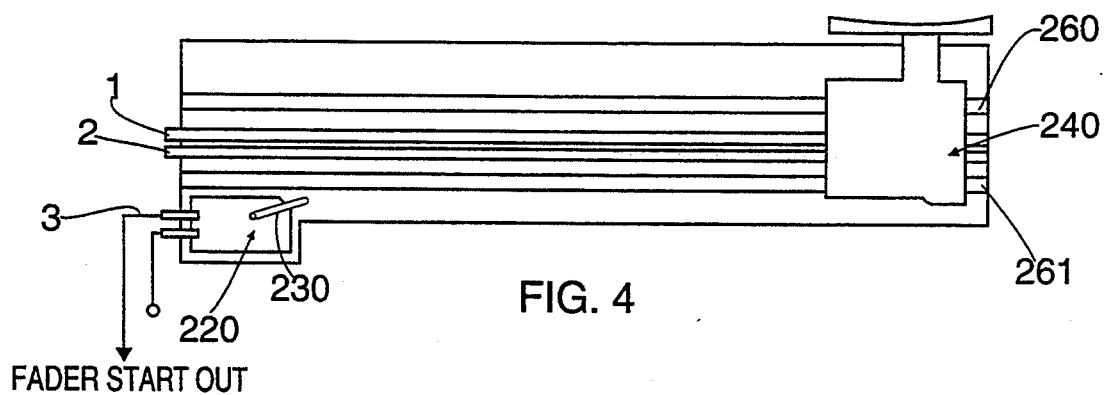
FIG. 4 is an illustration showing an existing audio fader with fader start functions in which the slider is not positioned at the zero gain or infinity resistance position.
Figure 6:
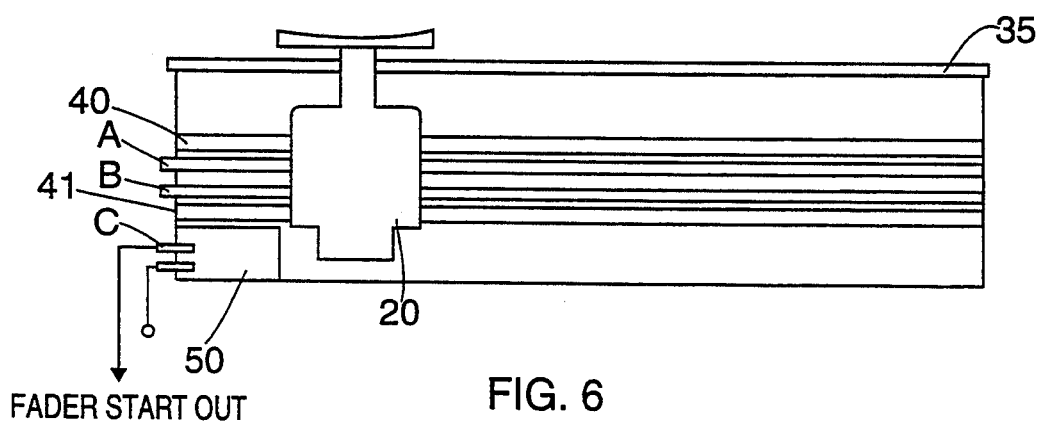
FIG. 6 is an illustration showing a cutaway side view of one embodiment of the present invention.
Figure 5:
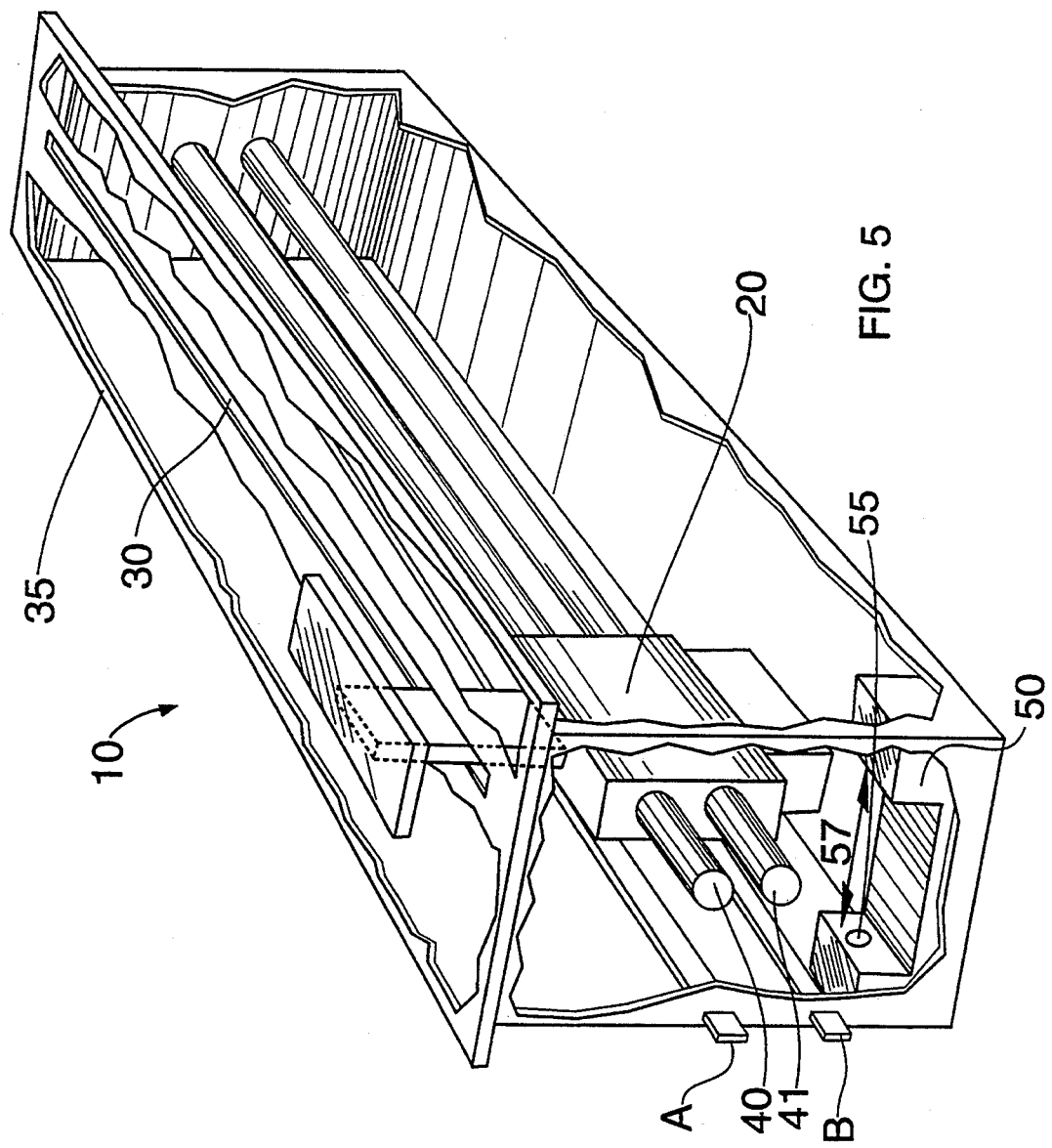
FIG. 5 is an illustration of one embodiment of the present invention.

FIG. 5 shows a perspective view of one embodiment of the present invention of audio fader 10. FIG. 6 shows a cutaway side view of one embodiment of the present invention. These FIGURES show a slider 20 which can be moved or slided from end to end of the slot 30 which is cut in a face plate 35. Beneath the surface of face plate 35 there are two guide tracks 40 and 41 which are parallel to slot 30 and extend the length of fader 10. Slider 20 is attached to guide tracks 40 and 41 in such a way that it can be moved or guided along the length of the guide tracks 40 and 41. Slider 20 is attached to an electrically conductive wiper 25 which makes electrical contact with a resistive track 30. Conductive wiper 25 also makes electrical contact with conductive track 26 which is connected to contact terminal B. A portion of slider 20 projects upwards through slot 30. Optical block 50 is situated at one end of fader 10. Fader 10 can be incorporated into a mixing or control console, or the like, such as that depicted in FIG. 1.

Figure 7:
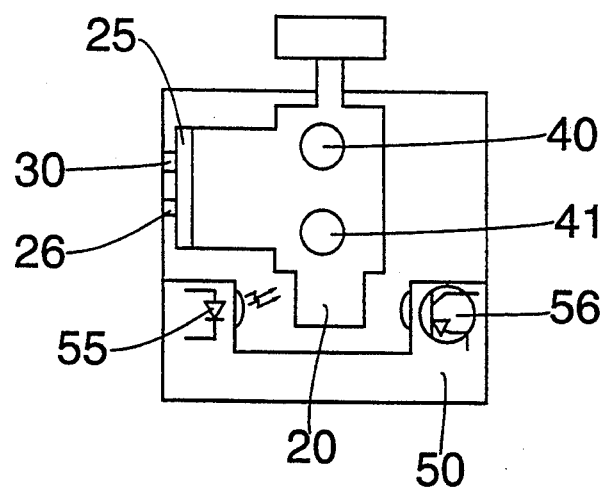
FIG. 7 is an illustration showing a front view of one embodiment of the present invention.

FIG. 7 shows a frontal cut away view of an embodiment of the present invention. Slider 20 is attached to wiper 25 which is electrically connected to contact terminal B by way of conductive track 26. Optical block 50 is positioned substantially beneath slider 20.

Figure 8:
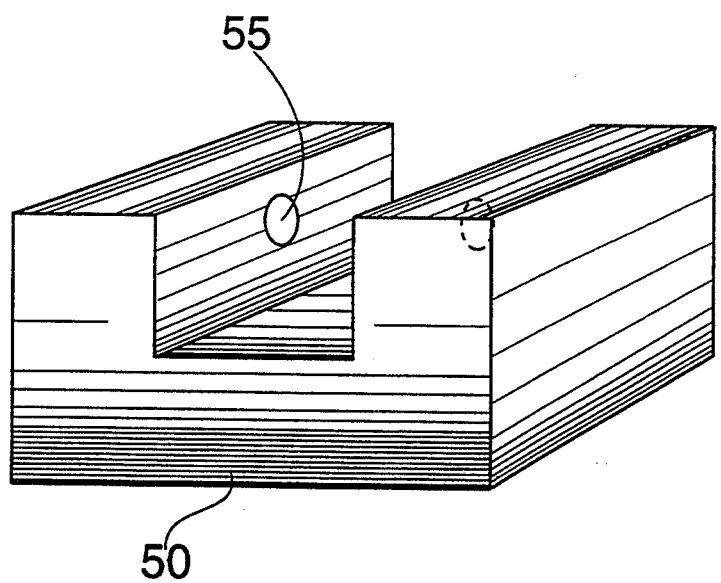
FIG. 8 is an illustration showing optical block 55.
Figure 9:
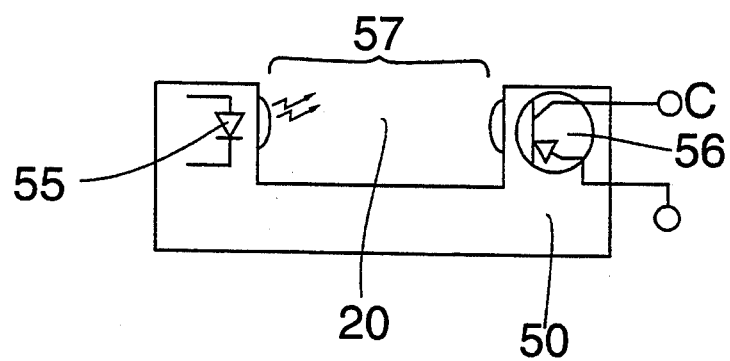
FIG. 9 is an illustration showing optical block 55.

With reference to FIGS. 5 and 6, it can be seen that the present invention provides for an audio fader having a slider 20 which can be moved, or slided, from end to end of a slot 30 which is cut in a face plate 35. Beneath the surface of face plate 35, there are two guide tracks 40 and 41 which are parallel to slot 30 and extend the length of fader 10. Slider 20 is attached to guide tracks 40 and 41 in such a way that it can be moved or guided along the length of the guide tracks 40 and 41. Further, slider 20 has an electrically conductive wiper 25 attached thereto to make electrical contact with resistive track 30. With reference to FIG. 7, it can further be seen that wiper 25 is electrically connected to contact terminal B via conductive track 26. Resistance track 30 is electrically connected to contact terminal A. As slider 20 is moved along guide tracks 40 and 41, the resistance value across terminals A and B is varied. A portion of slider 20 projects upward through slot 30 so as to be accessible to an operator. Optical block 50 is situated at one end of fader 10. As can be seen in FIG. 8, the shape of optical block 50 tends to resemble a "U" shape. With reference to FIG. 9, optical block 50 is comprised of an LED 55 which is positioned on one side of a gap 57 opposite photo sensitive transistor 56. Examples of optical blocks such as this are the LITEON model LTH-301A and model LTH-301-07. While these particular optical blocks provide for 0.061" and 0.02" wide gaps, respectively, between the LED and photo transistor, it will be appreciated that optical blocks having appropriate gap dimensions to meet specific physical requirements generally should be utilized. Photo sensitive transistor 56 is aligned with LED 55 so that light emitted by LED 55 may be sensed or detected by photo transistor 56. LED 55 may be, for example, an infrared light emitting diode such as a gallium arsenide infrared light emitting diode or the like. It will be recognized by those skilled in the art that other light sources may be utilized in place of LED 55. It will also be recognized by those skilled in the art that optical block 55 may take many forms. Further, it will be recognized that LED 55 and photo sensitive transistor 56 may be physically independent of each other and need not be housed within a unitary housing. Photo transistor 56 is responsive to light emitted by LED 55 and must be properly biased with an electrical charge. Photo sensitive transistor 56 is positioned and aligned with LED 55 in such a way that when slider 20 is moved to, or positioned, at the end of fader 10 which corresponds to an infinity (∞) position, or maximum attainable fader resistance, the light emitted by LED 55 is physically interrupted, or broken, by at least a portion of slider 20. When light from LED 55 is interrupted, photo transistor 56 stops conducting or turns off. When photo transistor 56 is not conducting, no fader start signal is generated. As slider 20 is moved along a travel path defined by guide tracks 40 and 41, away from optical block 50, light emitted by LED 55 is no longer interrupted by slider 20, and is sensed, or detected, by photo transistor 56 which begins to conduct or turn on. When photo transistor 56 begins to conduct, a fader start signal is caused to be produced at terminal C. It will be appreciated that guide tracks 40 and 41 may take many forms including, for example, a groove, a slot or the like. It will also be appreciated that any number of guide tracks may generally be used.

Because the present invention does not require physical contact between mechanical switching elements and the moving slider of an audio fader, the present invention allows a fader start signal to be generated without producing unwanted audible noises. Further, the feel of the audio fader of the present invention is smooth and consistent through the range of travel of the movable slider.

It will be appreciated by those skilled in the art that other modifications and variations of the invention described herein can be made without deviating from the scope of this invention. Further, it will also be appreciated by those skilled in the art that the present invention may also have applications as, for example, variable resistors used in lighting dimmers or control consoles such as those commonly used in theatrical or television lighting systems.

What is claimed is:

1. A fader comprising:
    an electrically resistive track;

a movable slider having a conductive wiper for making electrical contact with said electrically resistive track;

a guide track for supporting and guiding said movable slider along a path of travel; and photo sensitive switch responsive to a single predetermined position of said movable slider along said path of travel.

2. A fader according to claim 1 wherein said photo sensitive switch means further comprises:

a light source; and a photo sensitive transistor positioned so as to receive light produced by said light source.

3. A fader according to claim 2 wherein said light source includes a source of infrared light.

4. A fader according to claim 2 wherein said light source further comprises a gallium arsenide infrared emitting diode.

5. A fader according to claim 2 wherein said photo sensitive switch further comprises a silicon photo transistor.

6. A fader according to claim 5 wherein said silicon photo transistor further comprises an NPN photo transistor.

7. A variable resistor comprising:

a resistive track;

a contact terminal electrically connected to said resistive track;

a movable slider;

a wiper attached to said slider for making electrical contact with said resistive track; and photo sensitive switching means for causing a control signal of a predetermined level to be output upon movement of said slider from a position wherein said wiper is in contact with said resistive track and the electrical resistance value between said wiper and said contact terminal is at a maximum electrical resistance value.

8. A variable fader comprising:

a resistive track;

a movable slider having a path of travel;

a wiper attached to said slider for making electrical contact with said resistive track; and photo sensitive switching means comprising:

a light emitting diode positioned on one side of said path of travel; and a photo sensitive semiconductor positioned on the opposite side of said path of travel and aligned so as to receive light produced by said light emitting diode and said photo sensitive switching means is actuated only when said slider is positioned at a predetermined position along said resistive track.

9. A variable resistor comprising:

a face plate with a linear slot formed therein;

a resistive track;

a movable slider having at least a portion thereof which extends through said slot in said face plate;

a wiper attached to said movable slider for making electrical contact with said resistive track;

a guide track for supporting and guiding said movable slider along a path of travel;

a light emitting diode positioned on one side of said path of travel; and a photo sensitive transistor positioned on the opposite side of said path of travel and aligned so as to receive light produced by said light emitting diode when said slider is not positioned at a point along said path of travel so as to be between said light emitting diode and said photo sensitive transistor.

10. A control console comprising:

a housing;

a plurality of faders;

said faders comprising:

a resistive track;

a movable slider having a conductive wiper for making electrical contact with said resistive track;

a guide track for supporting and guiding said movable slider along a path of travel; and photo sensitive switch means which is actuated only upon positioning said movable slider at a predetermined location along said guide track.

11. A control console comprising:

a housing;

a plurality of faders;

said faders comprising:

a face plate with a linear slot formed therein;

a resistive track;

a movable slider having at least a portion thereof which extends through said slot in said face plate;

a wiper attached to said movable slider for making electrical contact with said resistive track;

a guide track for supporting and guiding said movable slider along a path of travel;

a light emitting diode positioned on one side of path of travel; and a photo sensitive transistor positioned on the opposite side of said path of travel and aligned so as to receive light produced by said light emitting diode only when said slider is not positioned at a location along said path of travel so as to be between said light emitting diode and said photo sensitive transistor.

12. A fader comprising:

an electrically resistive track;

a movable slider having a conductive wiper for making electrical contact with said electrically resistive track;

a guide track for supporting and guiding said movable slider along a path of travel; and switching means for outputting a fader start control signal comprising:

photo sensitive switch means responsive to a single predetermined position of said movable slider along said path of travel.

13. A fader according to claim 12 wherein said photo sensitive switch means further comprises:

a light source for producing light;

a photo sensitive transistor positioned so as to receive light produced by said light source; and a light blocking member to block the transmission of light from said light source to said photo sensitive transistor when said movable slider is positioned at a predetermined position along said path of travel and so as to allow the transmission of said light to said photo sensitive transistor when said movable slider is located along said path of travel at a location other than said predetermined position.

14. A fader according to claim 13 wherein said light source includes a source of infrared light.

15. A fader according to claim 13 wherein said light source further comprises a gallium arsenide infrared emitting diode.

16. A fader according to claim 13 wherein said photo sensitive semiconductor further comprises a silicon photo transistor.

17. A fader according to claim 16 wherein said silicon photo transistor further comprises an NPN photo transistor.

18. A variable resistor comprising:
a resistive track;
a contact terminal electrically connected to said resistive track; a movable slider;
a wiper attached to said slider for making electrical contact with said resistive track; and
switching means for outputting a fader start control signal comprising:
  photo sensitive switching means for causing a control signal of a predetermined level to be output upon movement of said slider from a position wherein said wiper is in contact with said resistive track and the electrical resistance value between said wiper and said contact terminal is at a maximum electrical resistance value.

19. A variable fader comprising:
a resistive track;
a movable slider having a path of travel;
a wiper attached to said slider for making electrical contact with said resistive track; and
switching means for outputting a fader start control signal comprising:
  photo sensitive switching means comprising:
    a light emitting diode positioned on one side of said path of travel;
    and
    a photo sensitive semiconductor positioned on the opposite side of said path of travel and aligned so as to receive light produced by said light emitting diode and said photo sensitive switching means is actuated only when said slider is positioned at a predetermined point along said resistive track.

20. A control console comprising:
a housing;
a plurality of faders;
said faders comprising:
  a resistive track;
  a movable slider having a conductive wiper for making electrical contact with said resistive track;
  a guide track for supporting and guiding said movable slider along a path of travel; and
  switching means for outputting a fader start control signal comprising:
    photo sensitive switch means which is actuated only upon positioning said movable slider at a predetermined point along said guide track.

21. A variable resistor comprising:
a face plate with a linear slot formed therein;
a linear resistive track;
a movable slider having at least a portion thereof which extends through said slot in said face plate;
a wiper attached to said movable slider for making electrical contact with said resistive track;
a guide track for supporting and guiding said movable slider along a path of travel;
switching means for outputting a ruder start control signal comprising:
  a light omitting diode positioned on one side of said path of travel; and
  a photo sensitive transistor positioned on the opposite side of said path of travel and aligned so as to receive light produced by said light emitting diode when said slider is not positioned at a point along said path of travel so as to be between said light emitting diode and said photo sensitive transistor.

22. A control console comprising:
a housing;
a plurality of faders;
said faders comprising:
  a face plate with a linear slot formed therein;
  a resistive track;
  a movable slider having at least a portion thereof which extends through said slot in said face plate;
  a wiper attached to said movable slider for making electrical contact with said resistive track;
  a guide track for supporting and guiding said movable slider along a path of travel;
  switching means for outputting a fader start control signal comprising:
    a light emitting diode positioned on one side of path of travel; and
    a photo sensitive transistor positioned on the opposite side of said path of travel and aligned so as to receive light produced by said light emitting diode only when said slider is not positioned at a point along said path of travel so as to be between said light emitting diode and said photo sensitive transistor.

* * * * *